Figure 1:
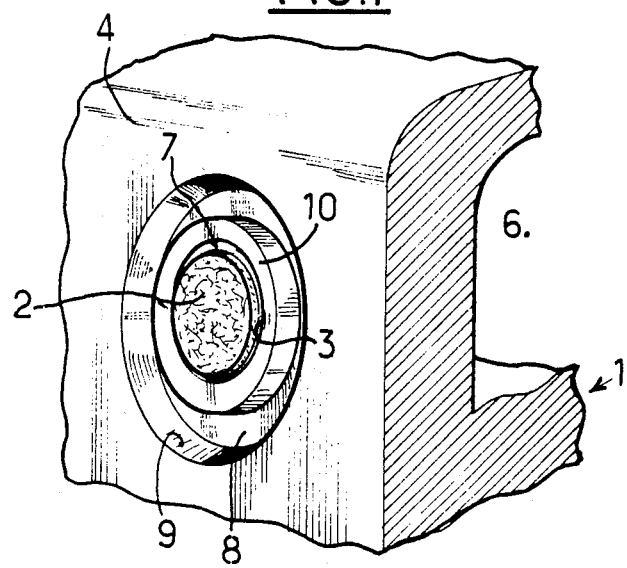

United States Patent [19]

Vincent

[11] Patent Number: 4,618,071
[45] Date of Patent: Oct. 21, 1986

[54] VENTING DEVICE FOR AN ELECTRONICS HOUSING

[75] Inventor: Jacques Vincent, Cahors, France

[73] Assignee: Allied Corporation, Morris Township, Morris County, N.J.

[21] Appl. No.: 798,203

[22] Filed: Nov. 14, 1985

[30] Foreign Application Priority Data

Nov. 29, 1984 [FR] France ............... 84 18163

[51] Int. Cl.$^4$ ............................................. B65D 51/16
[52] U.S. Cl. .......................... 220/371; 220/DIG. 27; 220/373
[58] Field of Search ........ 220/371, 373, 361, DIG. 27

[56] References Cited

U.S. PATENT DOCUMENTS 2,298,938 10/1942 Griffin, Jr. et al. ............... 220/373

Primary Examiner—George T. Hall
Attorney, Agent, or Firm—Russel C. Wells; Markell Seitzman

[57] ABSTRACT

The venting device includes a passage (3, 5) provided in a wall (4) of a housing (1) and connecting the inside and the outside of the housing (1). A filter (2), preferably made from porous metallic material, is force-fitted into the passage (3, 5). A peripheral channeling groove (8) provided in the outside surface of the wall of the housing (4) completely surrounds the opening of the passage (3, 5). This venting device may preferably be used in electronics housings fitted in the engine compartment of motor vehicles.

8 Claims, 3 Drawing Figures

U.S. Patent  Oct. 21, 1986  4,618,071

VENTING DEVICE FOR AN ELECTRONICS HOUSING

The present invention relates to a venting device for exchanging air between the inside of an electronics housing, particularly for use on motor vehicles, and its external environnement, designed in such a way as to allow the passage of air while preventing the passage of water.

The manufacture of a totally sealed electronics housing is a difficult and costly problem. For automobile applications, where cost problems are preponderant, it is not always possible to manufacture totally sealed electronics housings.

However, these housings must be able to function in the severe environmental conditions found in the engine compartment of a vehicle: water spray, fast changes in temperature, etc.

The problem posed by a housing that is not perfectly sealed is as follows: a hot housing sprayed with cold water is suddenly cooled and this has the effect of creating a partial vacuum inside this housing which results in an intake of air and possibly of water, dust, etc.

A known solution consits in designing a relatively sealed electronics housing and, in one side of this housing, making a controlled opening.

For this purpose, certain housings are provided with a simple opening in a side sheltered from direct water spray.

However, running water can easily enter the housing and cause short-circuits between the various components under power.

Another solution consists in inserting a plastic baffle in the opening of the housing. In this case, drops of water can run over this side without entering the opening because of the baffle, but this is not a barrier against the direct intake of water.

A silicone coated felt pad held in place by a part force-fitted into one side of the housing to be protected, is an effective screen against the direct water spray but this solution remains costly.

The purpose of the present invention is to provide a device which forms an effective barrier against water spray in an electronics housing, while having a low cost and being easy and fast to assemble.

For this purpose, the object of the invention is a venting device for an electronics housing, including a passage made in one wall of the housing connecting the inside and the outside of the housing and a filter fitted into the said passage, and a peripheral liquid channeling groove provided in the outside surface of said wall of the housing and completely surrounding the opening of the said passage.

Preferably, the filter comprises a porous metallic material obtained for example by sintering a metallic powder such as bronze or stainless steel.

The peripheral groove provided in the side of the housing deflects the water that may possibly run over the housing without the water coming into contact with the filter, which therefore does not have to have severe waterproof characteristics.

Preferably, the passage includes a seating in which the filter is force-fitted and a opening made between the bottom of the seating and the inside of the housing. The seating, the opening and the groove can be produced when casting the housing. The force fitting of the filter into the seating is simple and quick. The assembly therefore has the advantage of a relatively low overall manufacturing cost.

Figure 2:
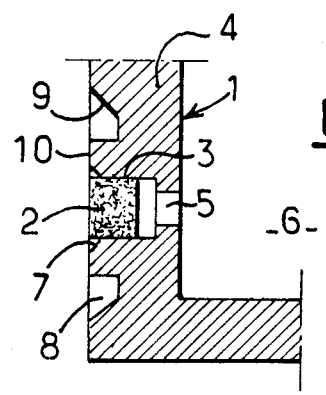
Figure 3:
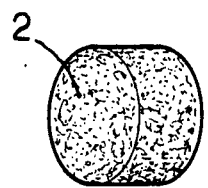

Other characteristics and advantages of the invention will become apparent from the following description of an embodiment given solely by way of example and illustrated by the appended drawings in which:

FIG. 1 is an external perspective view of a venting device fitted in the wall of an electronics housing, FIG. 2 is an axial cross-sectional view of the exchanger device in FIG. 1, FIG. 3 is a perspective view of the filter forming part of the device in FIGS. 1 and 2.

Referring to FIGS. 1 and 2, the venting device equipping an electronics housing 1 made of plastic or metallic material includes a filter 2 force-fitted into a seating 3 provided in the outside surface of a side wall 4 of the housing 1. The bottom of the seating 3 connects with the inside 6 of the housing 1 by means of an aperture 5. The edge of the seating 3 preferably has a chamber 7 facilitating the fitting of the filter 2 and, in addition, the flow of water around the end of the filter in the case of direct intake of water. Preferably the wall is placed in a substentially vertical position when the housing in mounted for operation for instance in the engine compartment of a motor vehicle.

However, the evacuation of the water that can flow over the outside surface of the housing wall 4 is mainly provided by a groove 8 of circular or similar shape, obtained by casting or machining, which completely surrounds the external opening of the passage consisting of the seating 3 and the aperture 5. This groove preferably has a trapezoidal cross-section defining a funnel-shaped outer edge 9 facilitating the channeling around the boss 10 provided between the groove 8 and the seating 3 of the water flowing over the wall 4 of the housing and its evacuation from the lower part of the groove.

FIG. 3 is a perspective view of the filter 2, here in cylindrical form like the seating 3. As a variant, the filter 2 can be of any appropriate shape, for example spherical, and the seating 3 having a shape that is complementary to that of the filter. The filter 2, made of metallic porous material is preferably produced by sintering metallic powder of bronze or stainless steel for example, so that it is inexpensive to manufacture. The absolute barrier threshold is determined according to the particles carried. Thus for example the filter 2 can be sintered from bronze balls of diameter less than or equal to 150 microns or 0.006 inch or from a stainless steel powder whose absolute barrier threshold is less than equal to about 30 microns or 0.0012 inch. As for the cylindral housing 3, this can have a diameter in the order of 5 millimeters or 0.2 inch and a depth of less than or equal to about 5 millimeters or 0.2 inch.

This venting device for an electronics housing enables a constant exchange of air between the outside and the inside of the housing while preventing condensation and the formation of droplets of water that could cause short-circuits and therefore an abnormal operation of the electronic system enclosed in the housing. The peripheral groove 8 protects the filter 2 from running water so that the filter does not need to have severe waterproof characteristics and can be made by an inexpensive process compatible with mass production.

I claim:

1. Venting device for an electronics housing, including a passage provided through a wall of the housing, said passage connecting the inside and the outside of the housing and a filter fitted into the said passage, and a peripheral liquid channeling groove provided in the outside surface of said wall and completely surrounding the opening of the said passage.

2. Venting device according to claim 1, wherein the filter is made of a porous metallic material.

3. Venting device according to claim 2, wherein the filter is obtained by sintering a metallic powder.

4. Venting device according to claim 3, wherein the filter is sintered from bronze balls having a diameter of less than or equal to about 150 microns or 0.006 inch.

5. Venting device according to claim 4, wherein the filter is sintered from a stainless steel powder having a absolute barrier threshold less than or equal to about 30 microns or 0.0012 inch.

6. Venting device according to claim 1, wherein said passage includes a seating in which the said filter is force-fitted and an aperture provided between the bottom of the seating and the inside of the housing.

7. Venting device according to claim 6, wherein the seating is cylindrical and has a diameter in the order of 5 millimeters or 0.2 inch and a depth of less than or equal to about 5 millimeters.

8. Venting device according to claims 1, has a trapezoidal cross-section defining a funnel-shaped outer edge for the collection and evacuation of running liquid.

* * * * *